United States Patent [19]
Vaisanen et al.

[11] Patent Number: 5,335,362
[45] Date of Patent: * Aug. 2, 1994

[54] METHOD OF TUNING AND COMPENSATING THE RECEIVED SIGNAL STRENGTH INDICATOR IN A RADIO TELEPHONE

[75] Inventors: Risto Vaisanen; Aki Leppanen, both of Salo, Finland

[73] Assignee: Nokia Mobile Phones Ltd., Salo, Finland

[*] Notice: The portion of the term of this patent subsequent to Dec. 31, 2008 has been disclaimed.

[21] Appl. No.: 586,075

[22] Filed: Sep. 21, 1990

[30] Foreign Application Priority Data

Sep. 25, 1989 [FI] Finland ................. 894530

[51] Int. Cl.$^5$ ............................. H04B 17/00
[52] U.S. Cl. ..................... 455/67.1; 455/67.4; 455/186.1; 455/226.1; 379/1
[58] Field of Search ............ 455/67, 69, 70, 88, 455/115, 185, 186, 226, 67.1, 67.4, 226.1, 226.2, 226.4, 67.7, 185.1, 186.1; 379/1, 27, 58

[56] References Cited

U.S. PATENT DOCUMENTS

| | | | |
|---|---|---|---|
| 4,234,964 | 11/1980 | Cieslak et al. | 455/226 |
| 4,245,352 | 1/1981 | Karpowcyz et al. | 455/226 |
| 4,580,274 | 4/1986 | Debany, Jr. et al. | 375/10 |
| 4,710,969 | 12/1987 | Fluck, Jr. et al. | 455/67 |
| 4,870,699 | 9/1989 | Garner et al. | 455/76 |
| 4,905,305 | 2/1990 | Garner et al. | 455/183 |
| 4,910,791 | 3/1990 | Dickinson | 455/4 |
| 4,939,786 | 7/1990 | McCallum et al. | 455/67 |
| 5,077,783 | 12/1991 | Leppänen | 379/27 |
| 5,201,063 | 4/1993 | Tam et al. | 455/67.4 |

FOREIGN PATENT DOCUMENTS

86/00769 1/1986 PCT Int'l Appl. .

OTHER PUBLICATIONS

Finnish Office Action dated Jun. 28, 1990 with English translation (2 pages).
European Search Report re: Application No. EP 90 31 0314 (2 pages).

Primary Examiner—Edward F. Urban
Assistant Examiner—Chi Pham
Attorney, Agent, or Firm—Darby & Darby

[57] ABSTRACT

In the method of tuning the received signal strength indicator the tuning results for selected operating conditions are stored in the microprocessor (10) memory. When the radio telephone (1) is in use, the received signal strength indicator (RSSI) reading is corrected with the tuning result in order to select the strongest antenna signal. The tuning is performed by connecting the tuning equipment (2) to the external interfaces (31, 32) of the radio telephone without opening it.

16 Claims, 1 Drawing Sheet

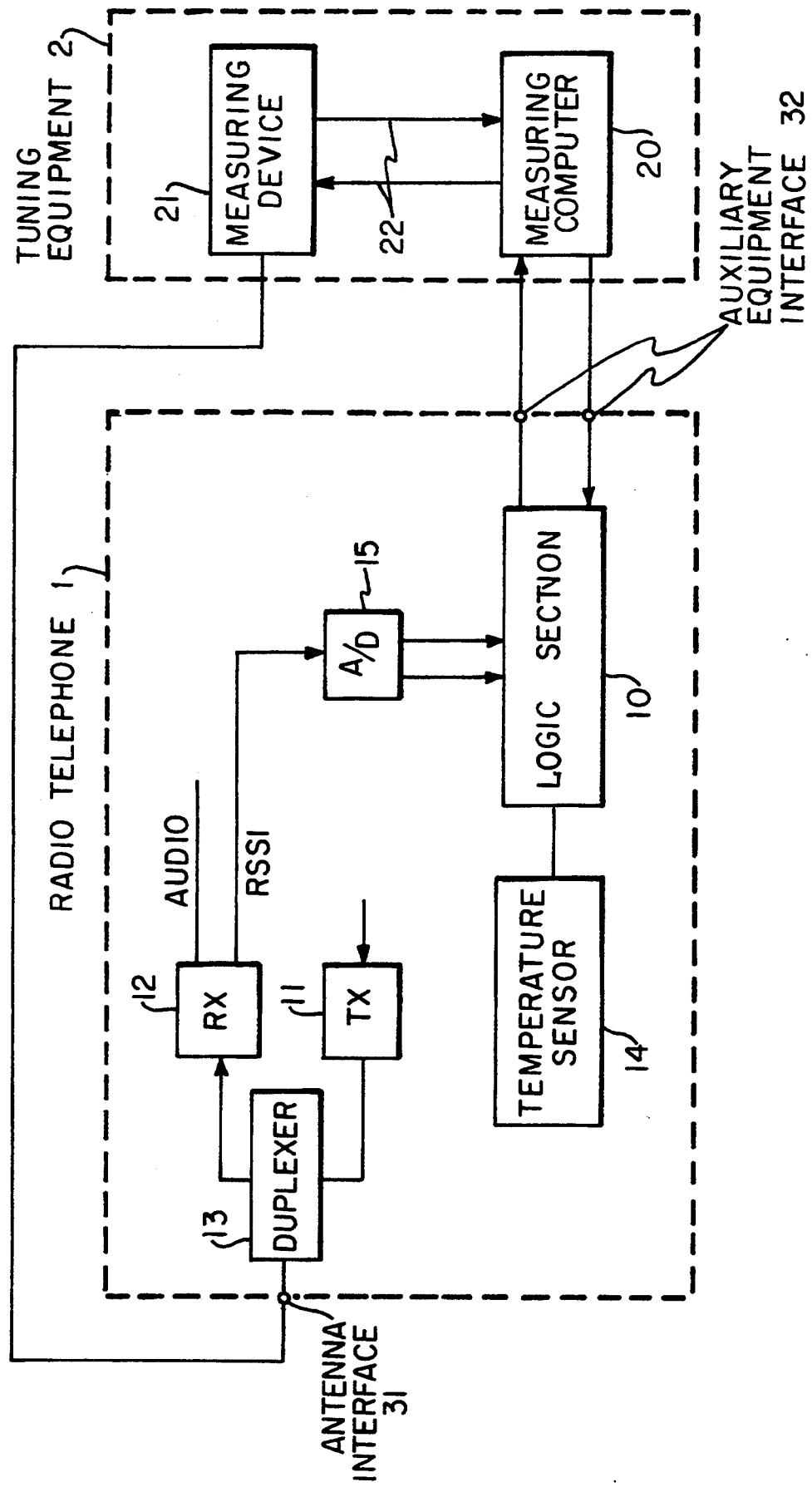

METHOD OF TUNING AND COMPENSATING THE RECEIVED SIGNAL STRENGTH INDICATOR IN A RADIO TELEPHONE

BACKGROUND OF THE INVENTION

The present invention relates to a method of tuning and compensating the signal strength indicator of a radio telephone having a logic section controlling the radio telephone's operation.

In radio telephones, a received signal strength indicator (RSSI) is used to measure the strength of a signal received by the telephone's antenna interface. This information is needed to select the appropriate channel of the radio telephone, i.e., the channel corresponding to the frequency of the strongest signal received. During operation, the measurement is performed by measuring a DC voltage level which is proportional to the strength of the intermediate frequency signal produced in the intermediate frequency section of the receiver. In the prior art, this voltage is generally measured using an analog-to-digital (A/D)-converter or comparators, which can identify, e.g., three signals with different strengths.

This type of prior art measurement suffers from two factors which produce a considerable amount of inaccuracy. Temperature variations cause the biggest inaccuracy by causing changes in the amplification in the RF and IF sections of the receiver. The second factor is the unevenness of the RF filter frequency response, which produces different measurement results at different frequencies.

In the prior art, compensation for temperature dependent changes is achieved by using analog technology, e.g., temperature dependent NTC resistors. However, the changes of individual radio telephone units can be somewhat different at various temperatures, and thus the compensating circuitry designed for a mass produced radio telephone will not operate identically for every unit, and the compensating circuitry could function inaccurately, due to component tolerances. Naturally, both of these results are unsatisfactory.

Previously, the frequency response errors of filters have not been corrected in any way, but rather, exceptionally stringent requirements have been imposed on the frequency response in the filter design, thus greatly increasing the size and price of the filters.

Generally, the radio telephone casing has to be opened to tune it in order to reach the various components needing adjustment.

SUMMARY OF THE INVENTION

The object of the invention is to devise a method and apparatus overcoming the above mentioned prior art problems and drawbacks.

In the present invention, individual tuning results for selected operating conditions are stored in the radio telephone's memory as compensating values, whereby the respective signal strength indicator reading is corrected by the stored compensating values during operation. Preferably, the tuning is made by connecting the tuning equipment to the normal external connections of the radio telephone, thus the tuning can be performed without opening the radio telephone casing. This tuning arrangement may be applied to the final testing of mass produced radio telephones.

The radio telephone according to the present invention has sensors connected to the logic section for detecting the radio telephone's operating conditions. A signal strength indicator accounts for the correction made with the compensating value stored in the memory. An A/D-converter between the logic section and the signal strength indicator allows the logic section to select the channel with the strongest signal.

BRIEF DESCRIPTION OF THE DRAWINGS

The invention is described in greater detail below by way of an example with reference to the accompanying drawing, in which the only FIGURE is a simplified block diagram illustrating an apparatus for implementing the tuning method of the present invention.

DETAILED DESCRIPTION OF A PREFERRED EMBODIMENT

The tuning equipment 2 is connected to the radio telephone 1 to be tuned via the antenna interface 31 and auxiliary equipment interface 32. A test signal selected for the tuning is directed from the device 21, into the antenna interface 31, through the duplex filter 13 to the receiver 12. The transmitter 11 is also connected to the filter 13. The measuring computer 20 of the tuning equipment is connected to the radio telephone logic section 10 through the auxiliary interface 32. The measuring computer 20 can control the radio telephone to select a desired channel (radio frequency) via the radio telephone logic section 10. For each level (e.g., five different levels), channel range, and temperature range, the measuring computer 20, via the logic section 10, reads the output of the A/D-converter 15 connected to the RSSI-interface of the receiver 12. The measuring computer stores set values corresponding to the compensation values for all relevant operating conditions. The values are stored in the non-volatile memory (e.g., ROM) of the logic section 10 and are corrected by the measuring computer with correction factors and constants for each channel range and/or for each temperature range.

The radio telephone also includes a temperature sensor 14 to detect the internal temperature of the radio telephone.

The logic section 10 includes, i.e., a microprocessor, a non-volatile memory for storing programs and compensating data, and an A/D converter (different from A/D-converter 15) for converting the voltage from the temperature sensor 14 into a digital format which can be used by the microprocessor. During tuning, the logic section 10 is connected to the measuring computer 20 via the auxiliary equipment interface 32, through which information is exchanged in both directions, e.g., information about the temperature measured by the temperature sensor 14 is relayed to the measuring computer 20 and set values from the measuring computer are sent to the logic section 10.

The relevant operating conditions of the radio telephone are: (1) the operating channel or channel range, (2) the temperature or temperature range (which is measured with the temperature sensor 14), and (3) the level range.

The tuning of the radio telephone according to the method of the present invention is carried out in the following manner. The radio telephone is placed in a climate chamber (cold/hot chamber), and the measuring devices 21 are connected to the antenna interface 31. First, the radio telephone is tuned at roomed temperature for the basic (or middle) channel. Next, constants for the extreme (very high and low) channels at room temperature are measured and tuned. Thereafter, the compensation for the channel under the cold and hot compensating operating conditions are determined.

The basic levels are tuned in the following steps:
(1) The measuring computer 20 directs the radio telephone 1 and the RF generator of the measuring devices 21 to generate a signal in the middle channel and set the first level to be tuned as the initial level.
(2) The computer 20 directs the radio telephone to measure the relevant RSSI level and the result is stored in the microprocessor memory.
(3) The computer 20 directs the generator to sequentially repeat steps (1) and (2) for each level (e.g., in a radio telephone of the NMT-900 system there are five levels).
(4) The compensating constants for each channel are determined as follows:
   (i) The respective RSSI readings at the given level are measured for the high and low channels, and the deviations from the middle channel reading are calculated with the measuring computer. These deviations are stored in the memory of the radio telephone 1 as compensating constants.

The temperature compensating factors are determined:
(5) The RSSI levels are measured in cold and hot conditions detected by the temperature sensor 14 at a certain RF level, and they are compared by the measuring computer 20 with the corresponding reading at room temperature. Factors are calculated based on the comparison results. These factors are multiplied with the respective measured RSSI level reading for hot or cold in order to compensate for the affects of temperature on the radio telephone.

The compensating values (or the compensating constants and factors) are used by software in the microprocessor so that, for the channels using compensating constants, first the RSSI level is read and then a compensating value is added, after which the level reading can be used for the radio telephone channel selection. In accordance with this method, the RSSI limits remain the same from the operating viewpoint.

It should be noted that the tuning may also be carried out with operating conditions in an order differing from the above, depending on the available climate chamber arrangement and other production reasons. The number of operating conditions to be tuned may be selected to suit the production and the operation of the radio telephone. The number of the operating conditions can be reduced in a convenient way by using, e.g., only three tuning points; one tuning point representing a middle range, a higher range, and a lower range, respectively, for the variable channels and/or the temperatures. For example, the ranges could be chosen:
   a middle channel representing a middle range, the highest and the lowest channel representing the higher and the lower ranges; and
   room temperature (e.g., 25° C.) for the range +5° . . . +45° C., maximum temperature (e.g., +55° C.) for the range +45° . . . +85° C., and minimum temperature (e.g., −10° C.) for the range −25° . . . +5° C.

In production, the tuning can be made in the final testing, when the radio telephone is otherwise completely ready. The tuning can now be made without opening the telephone's casing. Furthermore, by suitably programming steps (1) to (5) in the measuring computer 20, the tuning can be made completely automatic, whereby the results of the tuning will become more reliable (no human errors), and whereby it is possible to do an individual compensation for each radio telephone regarding both temperature and channels. Due to the automatization, the testing throughput time and the amount of required personnel will be reduced. From a production management standpoint, the inventive method signifies a great advantage, when, for example, the production is transferred to another plant, because the automatic tuning program does not require much training of personnel for the tuning tasks, as all information required in the tuning can be incorporated in the tuning programs of the measuring computer.

In a radio telephone realizing the method according to the invention, the temperature is measured with a sensor 14 and an A/D-converter (not shown). In accordance with the operating conditions the microprocessor of the logic section 10 selects from its non-volatile memory a relevant compensating constant or a set value tuned for the operating conditions, and the RSSI signal measured through the A/D-converter 15 is corrected in order to select the antenna signal which is strongest on reception.

The objects mentioned in the introduction will be met with a radio telephone 1 according to the invention, because larger variations of the attenuation in the pass band can be allowed in the RF filters, corresponding to a more uneven frequency response, permitting the use of smaller and less expensive filters. In the receiver 12, it is also possible to use less expensive components with an amplification (or attenuation) varying more or less individually at different temperatures. Tuning steps of separate modules are not needed either, because the tuning is made with an assembled radio telephone, utilizing its normal interfaces.

The invention can be applied to different types of analog and digital radio telephones, cellular radio telephones, portable, and mobile radio telephones.

While the present invention has been particularly shown and described with reference to preferred embodiments thereof, it is understood by those skilled in the art that various changes in the form and details may be made therein without departing from the spirit and scope of the invention.

We claim:
1. A method for correcting a radio telephone's received signal strength indicator, the radio telephone having a logic section controlling the radio telephone's operation, comprising the steps of:
   i) connecting external tuning equipment to the radio telephone via at least two interfaces;
   ii) generating a test signal in the external tuning equipment;
   iii) transmitting the test signal to the radio telephone via at least a first of the two interfaces such that the radio telephone generates a test received signal strength indicator (RSSI) signal in response to the test signal;
   iv) transmitting from the radio telephone to the external tuning equipment the test RSSI signal via at least a second of the two interfaces;
   v) generating in the external tuning equipment a compensating value corresponding to the transmitted test RSSI signal;

vi) transmitting the compensating value to the radio telephone logic section via at least the second interface;
vii) storing the compensating value in a memory of the logic section of the radio telephone; and
viii) compensating an actual RSSI signal by combining the actual RSSI signal with an appropriate compensating value.

2. The method of claim 1, wherein the method is performed without opening tile radio telephone.

3. The method of claim 1, wherein the step of generating a test signal involves generating signals on various channels of said radio telephone; and the step of compensating an actual RSSI signal comprises:
   i) generating an actual RSSI signal in response to an actual radio telephone signal;
   ii) generating a corrected actual RSSI signal by correcting the actual RSSI signal with the compensating value; and
   iii) selecting a best channel for the actual radio telephone signal according to the corrected actual RSSI signal, the corrected actual RSSI signal indicating a frequency of a strongest signal received.

4. The method of claim 3, wherein the step of compensating further comprises detecting an output of an analog-to-digital converter in the radio telephone using a computer arranged in the external tuning equipment.

5. The method of claim 4, wherein the step of compensating further comprises applying the compensating value to the output of the analog-to-digital converter in order to correct the actual RSSI signal.

6. The method of claim 1, wherein the steps of generating and transmitting the test signal, transmitting the test RSSI signal, and generating a compensating value are performed sequentially for several operating conditions.

7. The method of claim 6, wherein the steps of generating and transmitting the test signal further comprise sequentially generating and transmitting test signals representing at least one of a different operating channel and a different level.

8. The method of claim 6, wherein the method is performed at varying temperatures.

9. The method of claim 8, wherein the step of generating a compensating value includes compensating the test RSSI signal in response to a temperature of the radio telephone.

10. An apparatus for correcting a radio telephone's received signal strength indicator signal, the radio telephone having a logic section for controlling the radio telephone's operation and a received signal strength indicator means, comprising:
   (a) tuning equipment external to the radio telephone, including:
      i) means for generating a test signal having an operating channel and a level:
      ii) means for transmitting the test signal to the radio telephone;
      iii) means for receiving a signal strength indicator signal (RSSI) generated by the received signal strength indicator means of the radio telephone in response to the transmitted test signal;
      iv) means for generating a compensating value in response to the received RSSI signal; and
      v) means for transmitting the compensating value to the radio telephone: and
   (b) signal processing equipment in the radio telephone logic section, including:
      i) means for receiving one of the test signal transmitted from the external tuning equipment and an actual signal, and transmitting it to the RSSI indicator means;
      ii) means for transmitting to the external tuning equipment an RSSI signal generated in response to a test signal;
      iii) means for storing the compensating value transmitted from the external tuning equipment; and
      iv) means for applying the compensating value to an RSSI signal generated in response to the actual signal.

11. The apparatus of claim 10, further including sensors for detecting operating conditions of the radio telephone, said sensors being connected to the logic section of the radio telephone.

12. The apparatus of claim 11, wherein the logic section comprises a microprocessor.

13. The apparatus of claim 12, wherein the sensors further include a temperature sensor and the logic section includes a microprocessor.

14. The apparatus of claim 10, wherein:
   the test signal generating means generates a plurality of test signals having at least one of a varying operating channel and a varying level;
   the RSSI indicator means generates a signal for each received test signal;
   the means for generating a compensating value generates a compensation value for each RSSI signal received; and
   the means for storing the compensating value stores each compensating value generated by the means for generating a compensating value.

15. The apparatus of claim 10, further comprising a temperature sensor means connected to the logic section for sensing an operating temperature of the radio telephone and for generating a temperature compensating value.

16. The apparatus of claim 15, wherein the temperature compensating value is part of the RSSI signal generated in response to the test signal.

* * * * *